United States Patent
Suzuki et al.

(10) Patent No.: US 7,525,110 B2
(45) Date of Patent: Apr. 28, 2009

(54) MULTIPLE IRRADIATION EFFECT-CORRECTED DOSE DETERMINATION TECHNIQUE FOR CHARGED PARTICLE BEAM LITHOGRAPHY

(75) Inventors: Junichi Suzuki, Saitama (JP); Keiko Emi, Ibaraki (JP); Takayuki Abe, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 234 days.

(21) Appl. No.: 11/671,789

(22) Filed: Feb. 6, 2007

(65) Prior Publication Data

US 2007/0187624 A1    Aug. 16, 2007

(30) Foreign Application Priority Data

Feb. 14, 2006  (JP)  ............................. 2006-036639

(51) Int. Cl.
  *A61N 5/00*  (2006.01)
(52) U.S. Cl. ............................................. 250/492.22
(58) Field of Classification Search ............. 250/492.22
  See application file for complete search history.

(56) References Cited

U.S. PATENT DOCUMENTS 6,783,905 B2 * 8/2004 Yang ........................... 430/30
7,241,542 B2 * 7/2007 Hudek et al. ................... 430/30
7,435,517 B2 * 10/2008 Hudek et al. ................... 430/30

FOREIGN PATENT DOCUMENTS

| JP | 11-204415 | 7/1999 |
| JP | 3680425 | 5/2005 |

OTHER PUBLICATIONS

U.S. Appl. No. 11/460,848, filed Jul. 28, 2006, Keiko Emi, et al.
U.S. Appl. No. 11/535,725, filed Sep. 27, 2006, Junichi Suzuki, et al.

* cited by examiner

*Primary Examiner*—Kiet T Nguyen
(74) *Attorney, Agent, or Firm*—Oblon, Spivak, McClelland, Maier & Neustadt, P.C.

(57) ABSTRACT

A charged-particle beam microlithographic apparatus is generally made up of a pattern writing unit and a system controller. The writer has an electron beam source and a pattern generator for forming a pattern image on a workpiece. The system controller includes a unit for correcting proximity and fogging effects occurrable during pattern writing. This unit has a first calculator for calculating a proximity effect-corrected dose, a functional module for calculation of a fog-corrected dose while including therein the influence of the proximity effect, and a multiplier for combining the calculated doses together to determine a total corrected dose. The module has a second calculator for calculating a variable real value representing the proximity-effect influence to be considered during fog correction, and a third calculator for calculating using this value the fog-corrected dose.

17 Claims, 7 Drawing Sheets

MULTIPLE IRRADIATION EFFECT-CORRECTED DOSE DETERMINATION TECHNIQUE FOR CHARGED PARTICLE BEAM LITHOGRAPHY

CROSS-REFERENCE TO RELATED APPLICATION(S)

Priority is claimed to Japanese Patent Application No. 2006-036639, filed Feb. 14, 2006, the disclosure of which is incorporated herein by reference.

FIELD OF THE INVENTION

The present invention relates generally to energy radiation lithography technologies and, more particularly, to a technique for numerical determination of an optimal, exposure dose to correct multiple irradiation effect of a charged particle beam which occurs when an ultra-fine pattern is drawn or "written" on a workpiece. Electrons injected into resist on a workpiece (ex. mask substrate) are reflected in the mask substrate and expose resist again. This causes CD deviation and is called proximity effect. The reflected electrons are reflected at a ceiling of writing chamber and expose resist on the mask again. This also causes CD deviation and is called fogging effect. These two phenomena are called multiple irradiation effect in this specification. This invention also relates to an integrated circuit pattern writing lithographic apparatus and methodology using the beam dose correction technique.

DESCRIPTION OF RELATED ART

As highly integrated semiconductor devices further advance in complexity and miniaturization, the lithography technology for generation and depiction of ultrafine circuit pattern shapes is becoming important more and more. In recent years, semiconductor circuit devices decrease in minimum feature size of on-chip circuit patterns with an increase in integration density of ultralarge-scale integrated (ULSI) circuitry. To form a desired circuit pattern on substrates of such semiconductor devices, a high accuracy and ultrafine original image pattern, i.e., "master" pattern, is needed. This master pattern is called a photo-mask, also known as a reticle. Usually, this type of pattern is fabricated by use of high-accuracy electron beam photolithographic apparatus with superior image resolutions.

Currently available variable-shaped electron beam lithography apparatus is typically made up of a movable stage or "table" structure which supports thereon a target object such as a workpiece to be processed, and a scanning electron beam pattern generator unit including an electron optics. This optics includes an electron beam source, a couple of spaced-apart beam-shaping aperture plates (also known as "blankers"), and more than one deflector coil operatively associated therewith. Each aperture plate has a rectangular opening or hole as formed therein.

An electron beam emitted from the source first passes through the hole of the upper aperture plate and is then deflected by the deflector to reach the hole of the lower aperture plate. By this aperture, the beam is variable-shaped in cross-section and is then irradiated or "shot" onto the surface of a workpiece placed on the stage. By adequate control of the scanning of the variable-shaped beam and the stage's continuous or discontinuous motions, it is possible to draw or "write" for exposure a desired circuit pattern on the workpiece. In the field of ultrafine lithography technologies, such scheme is called the "variable shaped beam (VSB) pattern writing" in some cases.

In electron beam pattern writing processes, it is required to control the beam irradiation more precisely to thereby achieve superior pattern line-width uniformity in an entire area of the surface of a target workpiece, such as a photomask or else. Unfortunately, it remains very difficult for the existing technology to completely prevent any undesired variations or fluctuations of line pattern sizes, which occur due to unwanted multiple irradiation effect, that is, proximity effect and fogging effect. For example, suppose that an electron beam is shot onto a mask with a resist film deposited thereon to thereby write a circuit pattern on its top surface. In this case, certain kind of linewidth size variations can occur, which is known as the proximity effect among those skilled in the art to which the invention pertains. This is caused by the so-called back scattering, which takes place due to the electron beam's behavior which follows: after transmission of the resist film, the beam is reflected from its underlying layer to again enter the resist. Its influence range is usually over ten micrometers ($\mu$m), or more or less. This proximity effect-raised size variations would result in a decrease in accuracy of ultrafine depiction pattern having downscaled minimum feature sizes.

Other occurrable size variations include unwanted resist irradiation due to multiple scattering of electrons with relatively wide coverage. This is called the fogging effect in the photolithography art, also known as "smoke" in some cases. More specifically, this image blur phenomenon is such that back-scattered electrons occurring due to the proximity effect escape from the resist to scatter again at a lower plane of electron lens barrel and then reirradiate the mask. The fogging is much greater in influence range than the proximity effect: it ranges from several millimeters to several tens of millimeters. This fog also affects the accuracy of circuit pattern. Especially in the manufacture of ULSI circuit chips having the minimum feature size on the order of magnitude of nanometers, the proximity and fogging effects bring undesired irregularities of the finished sizes of pattern, such as line widths. Thus the influence thereof is serious.

A further size variation factor is what is called the loading effect, which takes place during etching processes to be done after having drawn a circuit pattern. This arises from inherent differences in density of line segments of the circuit pattern. Specifically, this phenomenon is such that when the patterned resist film is used as a mask is to etch its underlying light shield film, this film experiences unwanted size variations. The loading effect-caused size variations also affect the circuit pattern accuracy.

Attempts are made until today to reduce or eliminate the proximity/fogging effect-raised pattern size variations. One approach to doing this is disclosed, for example, in Published Unexamined Japanese Patent Application No. 11-204415, i.e., JP-A-11-204415. A beam dose correction technique for minimization of variations due to the loading effect is found in Japanese Patent No. 3680425.

One ordinary approach to avoiding such pattern size variations occurring due to the proximity effect and the fogging effect is to adjust and control the dose of a pattern writing beam in such a way as to "absorb" them. More specifically, a high-speed/high-performance computer is used to calculate an optimal dose of such beam. Then irradiate the workpiece with the charged particle beam at this corrected dose to thereby write a circuit pattern.

To calculate the corrected beam dose Dp, after having input the image data of an original pattern to be written, calculate a proximity effect-corrected dose and a fogging-corrected dose, respectively. The calculation of these corrected dose values is performed by a method having the steps of subdividing the workpiece's pattern write area into a matrix of rows and columns of small rectangular tile-like regions, called the "mesh" regions, and solving a prespecified integral equation on a per-mesh basis. Respective corrected doses thus calculated are combined together to obtain a "final" corrected dose. Then, beam control is done so that the beam falls onto the workpiece surface at this dose.

To calculate the fog-corrected beam dose Df, a specific mathematical formula is used which defines the absorption amount E of a resist film material concerning the fog effect. This formula contains in its integration term a mask surface position-dependent Df(x,y) value. If this Df value within integration is deemed to be constant, the resultant computing equation is simplified. This equation suggests that in order to obtain the intended fog-corrected dose, it is a must to repeatedly execute again and again similar integral calculations over the whole area of the fogging effect's influence range. This will be readily understandable by recalling the fact that the fogging phenomenon per se never exists independently and that the fogging is originated from the behavior of back-scattered electrons produced by the proximity effect. As previously stated, the fogging is much greater in influence range than the proximity effect. Thus, the resulting computation tasks required therefor become significant drastically. In other words, the approach to directly executing integral calculations for fogging correction in conformity with the formula in a straight manner without any ingenuity would result in waste of computer resources while unrealistically increasing the calculation time required—this is true even if it is a highly advanced computer with extra-high speed performances. Additionally, due to the "within-integration-term Df constant" deeming, it is unavoidable that nonnegligible errors (e.g., 5%, or more or less) take place in the calculated value of the fog-corrected dose.

One way of shortening the calculation time is to presume, when calculating the fog-corrected dose Df, that the proximity effect-corrected dose Dp stays constant within its integration region. In other words, upon calculation of the fog-corrected dose, the proximity effect-corrected dose Dp involved therein is adventurously fixed to a constant value, thereby to noticeably simplify the calculation equation required. Using this presumption—namely, "proximity effect constancy" approximation—to calculate the value Df per mesh region with its size of 1 millimeter (mm) as an example, the resulting computation task amount is appreciably lessened, resulting in a substantive decrease in processing time. This enables achievement of high-speed pattern writing.

Unfortunately, the advantage of this approach does not come without accompanying penalties as to an increase in fog correction errors. Accordingly, under the dramatic growth in lithography of recent ULSI circuit patterns with ultrafine feature sizes and further enhanced integration densities, it is desired to establish an advanced proximity-effect/fogging correction technique adaptable for use in shaped charged-particle beam lithographic systems capable of satisfying the conflicting demands: maximizing the accuracy of high precision pattern writing/exposure, and simultaneously, minimizing a processing time as taken therefor.

BRIEF SUMMARY OF THE INVENTION

In accordance with one aspect of this invention, a new and improved charged-particle beam lithographic apparatus employing a multiple irradiation effect correction technique unique to the invention is provided. This apparatus is generally made up of a pattern writing unit and a control unit operatively connected to the pattern writing unit. The writing unit has a radiation source for emitting an energy beam and a beam column operative as a beam pattern generator for deflecting the beam to opportunistically adjust traveling thereof to thereby form a prespecified circuit pattern image on a workpiece. The control unit includes a device for correcting the proximity and fogging effects occurrable during pattern imaging using the beam. This correction device includes a first calculator which calculates a proximity effect-corrected dose for correction of the proximity effect, a functional module for calculation of a fog-corrected dose for correction of the fogging effect while including therein the influence of the proximity effect, a combiner or multiplier responsive to receipt of the calculated doses for combining them together to thereby numerically determine a total corrected dose and for generating at its output a signal indicative of the total corrected dose, and a beam controller responsive to receipt of the output signal for using the total corrected dose to provide a beam control signal for transmission to the beam column. The functional module is arranged including a second calculator unit for calculation of a variable real value indicating the influence of the proximity effect to be taken into account during the fog correction, and a third calculator unit operatively associated with the second calculator unit for using the variable value of the proximity effect to thereby calculate the fog-corrected dose.

In accordance with other aspects of the invention, a method for beam dose correction adaptable for use in lithographic systems for writing a pattern on a target workpiece by use of a beam of energy radiation is provided. This method includes the steps of calculating a proximity effect-corrected dose for correction of a proximity effect occurrable during pattern writing, calculating a fog-corrected dose for correction of a fogging effect occurring during the pattern writing using the beam while including influence of the proximity effect, determining a total corrected dose by combining together the doses calculated, and controlling the beam based on the total corrected dose. The step of calculating a fog-corrected dose includes a first substep of calculating a variable real value indicative of influence of the proximity effect to be taken into account during fog correction, and a second substep of using the variable value of the proximity effect to calculate the fog-corrected dose.

The proximity/fogging effect correction technique incorporating the principles of the invention may be arranged by a hardware-based configuration including electrical and/or electronic circuits. Alternatively the principal functionality thereof is implementable by using a computer-executable software program or programs, a firmware-based arrangement, or any possible combinations of more than two of the hardware, software and firmware configurations.

DETAILED DESCRIPTION OF THE INVENTION

Figure 1:
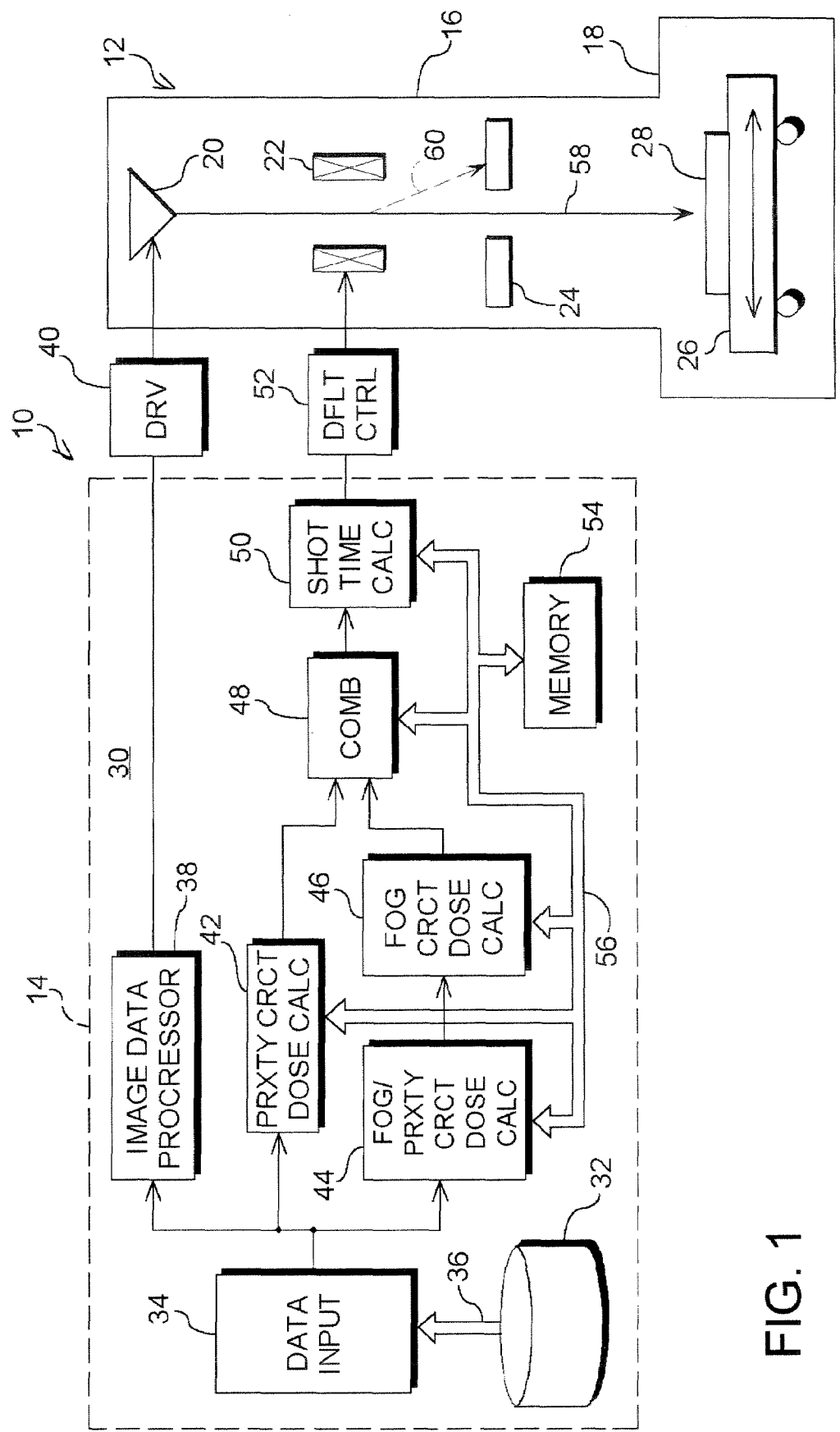
FIG. 1 is a diagram showing schematically an entire configuration of a variable-shaped electron beam pattern microlithographic apparatus in accordance with one embodiment of this invention.

A variable-shaped electron beam lithography (EBL) apparatus embodying the invention is shown in FIG. 1 in the form of a block diagram of some major components thereof. As shown herein, this EBL apparatus is entirely indicated by reference numeral 10. EBL tool 10 is generally made up of a circuit pattern drawing or "writing" unit 12 and a control unit 14 operatively associated therewith. The pattern write unit 12 includes a tower-like outer housing structure 16, called an electron lens barrel, and a processing chamber 18.

The electron lens barrel 16 has a scanning electron beam pattern generation unit as built therein. This pattern generator is constituted from a variable-shaped electron beam column, which includes an electron gun assembly 20, a blanking deflection coil 22, and a blanking aperture plate 24. In the process chamber 18, a table-like structure 36 is situated which is movable in two orthogonal axes that define a horizontal plane, i.e., X coordinate axis and Y coordinate axis. The table 26 will be referred to as "XY stage" hereinafter.

This XY stage 26 supports on its top surface a workpiece 28 under pattern writing and is driven by a known actuator (not shown) to move continuously or discontinuously. Examples of the workpiece 28 include, but not limited to, a reticle, a photo-mask with or without a resist film being deposited thereon, and a wafer, which are subject to the formation of an ultrafine circuit pattern(s) for use in the manufacture of advanced ULSI semiconductor devices. In this embodiment a resist-formed photomask is used for purposes of convenience in discussion herein.

The control unit 14 includes a system controlling computer 30 and a large-capacity data storage unit 32 which is operatively connected thereto. This storage 32 may function as a database (DB) that stores therein image data of ultrafine circuit patterns of high integration densities having minimum feature sizes on the order of magnitude of nanometers (nm). Storage 32 may also store other data, such as preset pattern writing conditions and various coefficients and constants for use in correction processes. The DB storage 32 may illustratively be a high speed-accessible large-capacity magnetic disk device. Other examples of storage 32 are hard disk drives (HDDs), a redundant array of independent disks (RAID), magneto-optic (MO) disk devices, rewritable optical disk devices, currently established or next-generation digital versatile disk (DVD) devices and other similar suitable storage/record media.

As shown in FIG. 1, the control computer 30 includes a data input unit 34 which is connected to the storage 32 via a data transmission bus 36. This input unit 34 is in turn connected to a draw image data processing unit 38. This image data processor 38 is linked to a driver circuit 40 of the electron gun 20 in the above-noted pattern write unit 12.

The input unit 34 is also connected to a functional module 42 that is operable to determine through computation a proximity effect-corrected beam irradiation amount or dose and also to a serial combination of a function module 44 for calculating a proximity effect-corrected dose for exclusive use during fogging correction—say, fog correction-use proximity effect-corrected dose—and a function module 46 for calculation of a fog-corrected dose. The proximity effect-corrected dose calculator unit 42 and the fog-corrected dose calculator unit 46 are connected at their outputs to input nodes of a value combining unit 48, respectively. This combiner 48 is illustratively a multiplier that functions to combine or "superpose" together the corrected dose values as output from the calculators 42 and 46. Combiner 48 has its output connected to a shot time calculation unit 50, which operates to calculate the real irradiation time of a charged particle beam—here, a shaped electron beam. The shot time calculator 50 has a built-in signal amplifier (not shown) and is connected to a circuit 52 for deflection control of the blanking deflector 22 in the pattern writing unit 12.

The function modules 44 to 50 for beam dose correction processing in the control computer 30 are arranged to have accessibility to a memory 54 by way of an internal data transfer bus 56. In other words, each function module sends its calculation result to the memory 54 for temporary storage therein and reads data from this memory 54. Memory 54 may typically be a semiconductor memory. Examples of it are a random access memory (RAM), electrically erasable and programmable read-only memory (EEPROM), "Flash" memory or functional equivalents thereto.

Under control of the computer 30, the beam deflection control circuit 52 controls the deflector 22 in such a way as to appropriately deflect an electron beam 58 as emitted from the electron gun 20 to thereby guide it to fall onto each aimed location on the exposure surface of the photomask 28 being mounted on XY stage 26, thereby writing a pattern of desired circuit shapes thereon. Note here that the respective calculators 42 to 50 of the control computer 30 is configurable from hardware components, such as electrical or electronics circuits. These hardware components may be replaced by software programs executable by digital computers or, alternatively, by firmware or any possible combinations thereof. The software programs are preinstalled to the magnetic disk device 32 or to a separate nonvolatile storage or recording unit which is functionally equivalent thereto. Some major examples include HDDs, magnetic tape devices, ROMs, PROMs, EEPROMs, and Flash memories.

The electron beam 58 leaving the electron gun 20 is controlled so that its current density J is at a specified value. This beam 58 is deflected by the blanking deflector 22 under the control of deflection control circuit 52 in co-work with the system control computer 30 to pass through the hole of the blanking aperture plate 24 and then fall onto a desired position of the target workpiece 28 on XY stage 26. When a beam irradiation or "shoot" time has elapsed which permits the real beam dose on workpiece 28 to reach a prespecified level, it is a must to prevent excessive beam irradiation. To do this, the blanking deflector 22 deflects the electron beam 58 while the blanking aperture 24 blocks or "cuts off" the travelling of the beam to thereby ensure that beam 58 no longer reaches workpiece 28. A deflection voltage of such deflector 22 is appropriately adjustable by the deflection controller 52.

Within a time period for allowing beam irradiation (called the "beam ON" period), that is, while the blanking is turned off, the output electron beam 58 of the electron gun 20 travels to fall down almost vertically along an optical axis or "orbit" indicated by solid line in FIG. 1. On the contrary, within another time period for refusing beam shoot (called the "beam OFF" period), that is, while the blanking turns on, the electron beam 58 obliquely travels along an angled or "tilted" orbit indicated by dotted line 60 in FIG. 1 and thus is prevented by the blanking aperture plate 24 from further going ahead. Thus no rays of this beam arrive at the workpiece 28 which lies under the aperture plate 24.

Figure 2:
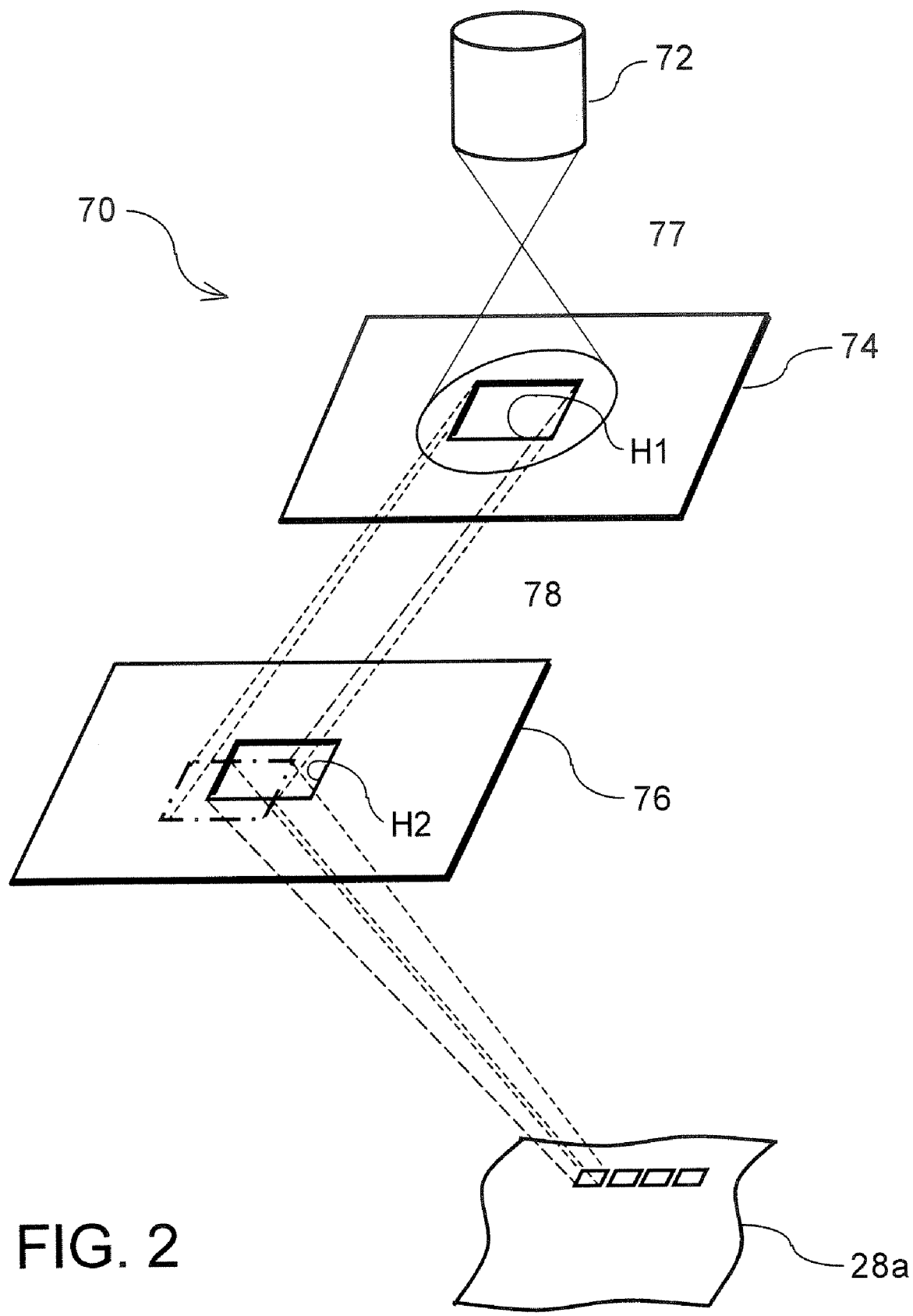
FIG. 2 is a pictorial representation of an electron optics employable in the lithography apparatus of FIG. 1.

The electron optics in the barrel 16 shown in FIG. 1 is also arrangeable in structure such as shown in FIG. 2. A variable-shaped beam (VSB) pattern generation system 70 as shown herein includes a charged particle source 72, which may be an electron gun assembly. This system also includes a pair of vertically spaced beam-shaping aperture plates 74 and 76. The upper aperture plate 74 has a rectangular opening or hole H1 as defined therein. The lower aperture plate 76 has a rectangular hole H2. An electron beam 77 as output from the source 72 is guided to travel through a known illumination lens (not shown) and then reach upper aperture plate 74. Then, the beam passes through a known projection lens and a beam-shaping deflector (each not shown) and arrive at the lower aperture 76. Next, the resulting beam that is shaped in cross-section by the hole H2 of aperture plate 76 is guided by an objective lens and objective deflector (not shown) to fall onto a target workpiece 28a.

During the "beam ON" (i.e., blanking OFF) session, the electron beam 77 leaving the gun 72 is guided to irradiate or "illuminate" a surface area of the upper aperture 74 which includes its rectangular hole H1. Passing through hole H1 results in the beam being shaped to have a rectangular cross-sectional image. Resultant shaped beam 78 that passed through this aperture hole H1 is projected onto the lower aperture 76 through the projection lens. A beam projection position on this aperture is controlled by the shaping deflector so that the beam is adequately changed both in shape and in size. The beam leaving the lower shaping aperture 76 is focussed by the objective lens and deflected by the objective deflector, whereby a focused beam spot is formed at a target position on workpiece 28a. In this electron beam lithography process, resist pattern size variations or fluctuations can occur due to the proximity effect and the fogging effect, resulting in undesired degradation of the uniformity of miniaturized linewidths on the workpiece surface, as has been discussed in the introductory part of the description.

Figure 3:
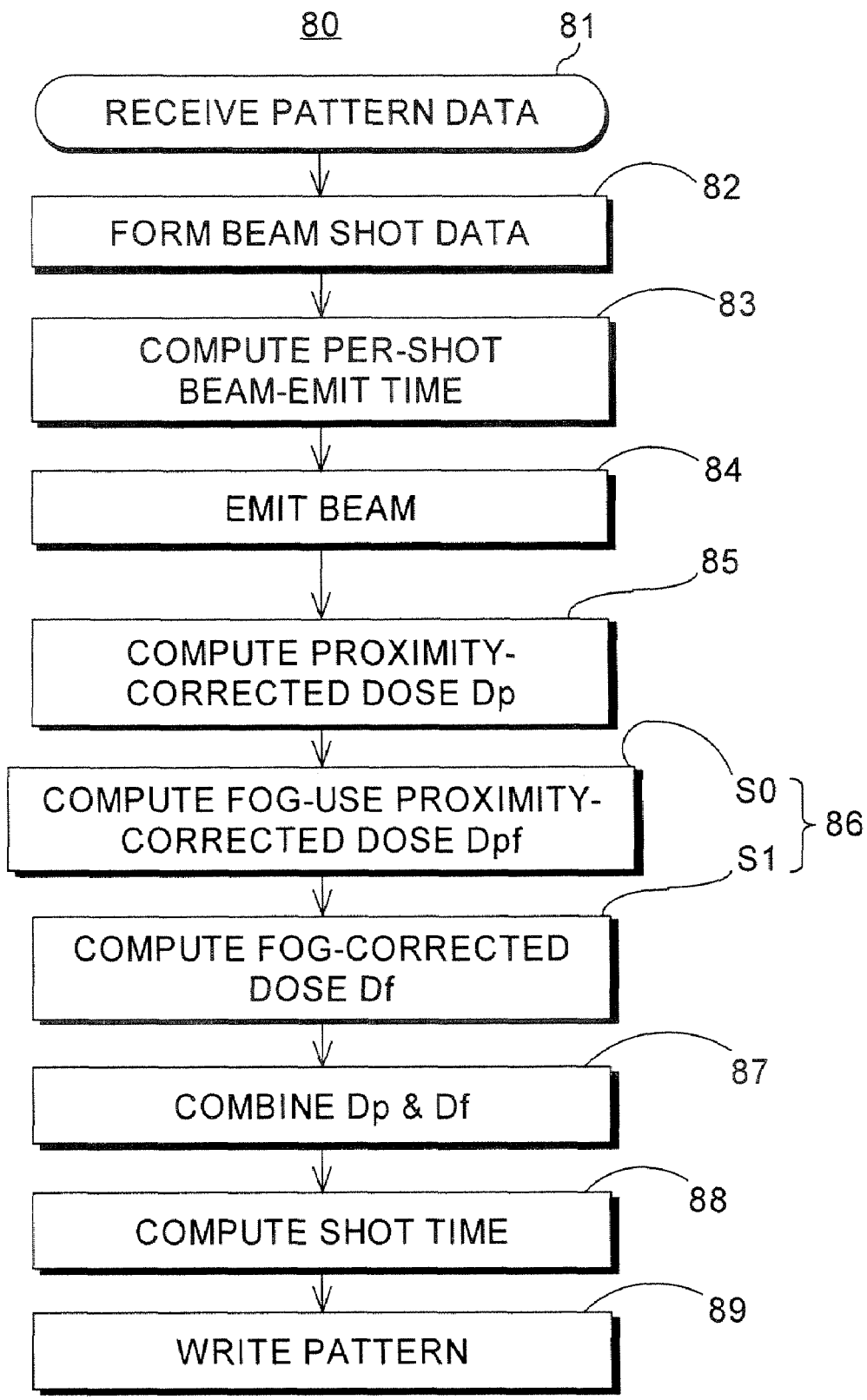
FIG. 3 is a flow diagram of major processes of a beam dose correcting method for use in the apparatus shown in FIG. 1.

See FIG. 3, which shows in flowchart form a process 80 for computing a beam dose that is corrected both in proximity effect and in fogging effect in order to prevent or at least greatly suppress pattern size variations occurrable during pattern writing of the EBL apparatus 10. The illustrative proximity effect/fogging-corrected beam dose computation procedure 80 starts with step 81, which permits the control computer 30 in the system controller 14 of FIG. 1 to acquire circuit pattern image data from the storage 32 and receive the data at its data input unit 34. This input unit passes or distributes ad libitum the pattern data among the image data processor 38 and the proximity effect-corrected dose calculator 42 plus the fogging effect correction-use proximity effect-corrected dose calculator 44. Then, the procedure 80 proceeds to step 82 which causes the image data processor 38 to use the input pattern data to create beam shot data. At step 83, calculate a beam irradiation time Tr at each shot on a real time basis. In subsequent step 84, the driver circuit 40 is responsive to receipt of this beam irradiation time Tr to activate the electron gun 20 so that it emits an electron beam 58 for drawing or "writing" a pattern of mask shapes on a top surface of the target photomask 28 being processed.

Next, the procedure 80 enters a processing stage for correction of the proximity effect and the fogging effect. Firstly at step 85, the proximity effect-corrected dose calculator 42 of FIG. 1 numerically determines through computation a corrected beam dose Dp(x,y) for correcting or "compensating" the proximity effect occurrable during mask pattern writing using the electron beam 58. This proximity effect-corrected dose Dp(x,y) is obtainable by solving an integral equation (1) which follows:

$$E = \frac{D(x, y)}{2} + \eta \int D(x', y') \kappa_p(x - x', y - y') dx' dy' + \theta \int D(x', y') \kappa_f(x - x', y - y') dx' dy'. \quad (1)$$

Here, E is the radiation absorption quantity of the resist of the photomask 28, which is a constant value. D(x,y) is the corrected beam dose, $\eta$ is the proximity effect correction coefficient, $\kappa_p(x,y)$ is the influence range of the proximity effect, $\theta$ is the fogging correction coefficient, and $\kappa_f(x,y)$ is the influence range of fogging effect. Experimentally it is known that the proximity effect influence range $\kappa_p(x,y)$ and fog influence range $\kappa_f(x,y)$ are each approximate to Gaussian distribution. The corrected dose D(x,y) is calculable by using Equation (2) below:

$$D(x,y) = D_p(x,y) D_f(x,y), \quad (2)$$

where Df(x,y) is the fogging-corrected beam dose, and Dp(x, y) is the proximity effect-corrected dose. The proximity effect-corrected dose Dp(x,y) thus calculated satisfies Equation (3) which follows:

$$E = \frac{D_p(x, y)}{2} + \eta \int D_p(x', y') \kappa_p(x - x', y - y') dx' dy'. \quad (3)$$

The proximity effect-corrected dose Dp(x,y) may be calculated using the constant value of absorption amount E which exhibits convergence in Equation (3) above, while involving therein higher orders of correction terms as indicated in Equations (4.1) to (4.4) below. Here, "n" denotes the order number of a correction term. U(x,y) is the back-scatter amount standardized.

$$D_p(x, y) = \sum_{i=0}^{\infty} D_p^i(x, y) = D_p^0(x) + D_p^1(x) + \ldots, \quad (4.1)$$

$$D_p^0(x, y) = \frac{E}{\frac{1}{2} + \eta U(x, y)}, \quad (4.2)$$

$$U(x, y) = \int \kappa_p(x - x', y - y') dx' dy', \quad (4.3)$$

$$D_p^n(x, y) = \frac{-\eta D_p^0(x, y)}{E} \left[ \begin{array}{c} \int D_p^{n-1}(x', y') \kappa_p \\ (x - x', y - y') dx' dy' - \\ D_p^{n-1}(x, y) U(x, y) \end{array} \right] (n \geq 1). \quad (4.4)$$

To reduce proximity effect correction errors to a practically acceptable level (e.g., 0.5%), the calculation of the proximity effect-corrected dose Dp(x,y) is performed up to a correction term of the third higher order n=3 in units of respective "mesh" regions, which are a matrix of rows and columns of small rectangular regions as divided from the photomask 28's pattern writing/exposure area. The side length of each mesh region is defined by taking account of the fact that the influence range of the proximity effect is usually ten plus a few micrometers (µm). As an example, let it be a square region with each side of 1 µm. The proximity effect-corrected dose Dp(x,y) is determined per each beam shot for execution of the intended correction. The per-shot proximity-corrected dose Dp(x,y) calculated in this way is stored in the memory 54 of FIG. 1. It should be noted here that while the integration formula (1) above involves therein fogging effect parameters, separated execution of the proximity effect correction and the fogging effect correction speeds up the processing without lowering the accuracy.

Next, the system procedure 80 enters a stage 86 for executing numerical determination of the fogging effect-corrected beam dose Df(x,y). This process includes a sub-step S1 of obtaining a fogging-corrected dose Df(x,y) as has been discussed in the introductory part of the description. Putting Equation (2) into Equation (1), the resist film's absorption is represented by:

$$E = \frac{D_p(x,y)D_f(x,y)}{2} + \qquad (5)$$
$$\eta \int D_p(x',y')D_f(x',y')\kappa_p(x-x',y-y')dx'dy' +$$
$$\theta \int D_p(x',y')D_f(x',y')\kappa_f(x-x',y-y')dx'dy'.$$

As the influence range of the fogging is several millimeters (mm) to several centimeters (cm) and is extraordinarily wider, beyond orders of magnitude, than the proximity effect's influence range of about ten-odd µm as stated previously, the value Df(x,y) is deemed to stay constant in the integration of the second term in the right-side part of Equation (5). As a consequence, Equation (5) is given by:

$$E = D_f(x,y)\left[\frac{D_p(x,y)}{2} + \eta \int D_p(x',y')\kappa_p(x-x',y-y')dx'dy'\right] + \qquad (6)$$
$$\theta \int D_p(x',y')D_f(x',y')\kappa_f(x-x',y-y')dx'dy'.$$

From this Equation (6) and the above-identified Equation (3), we obtain:

$$E = D_f(x,y)E + \theta \int D_p(x',y')D_f(x',y')\kappa_f(x-x',y-y')dx'dy'. \qquad (7)$$

In the integration of Equation (7), if it is assumed that Df(x,y) is a fixed value, then this equation may be approximated as follows:

$$E = D_f(x,y)[E + \theta \int D_p(x',y')\kappa_f(x-x',y-y')dx'dy']. \qquad (8)$$

Thus, the fogging-corrected dose Df(x,y) is given as:

$$D_f(x,y) = \frac{E}{E + \theta \int D_p(x',y')\kappa_f(x-x',y-y')dx'dy'}. \qquad (9)$$

To obtain the fog-corrected dose Df(x,y), an attempt may be done to execute the integration of denominator part of Equation (9). More specifically, perform integral calculation processing of:

$$Z(x,y) = \int D_p(x',y')\kappa_f(x-x',y-y')dx'dy'. \qquad (10)$$

Equation (10) above suggests that the proximity effect-corrected dose Dp(x,y) as contained therein is to be subject to integral calculation over the extended influence range of the fogging effect. However, this calculation amount is drastically significant since the fogging effect's influence range is extraordinarily larger than the proximity-effect influence range as stated previously. This in turn makes it inevitable to take a much increased length of time to complete such arithmetical processing. Due to this, it must be concluded that mere direct calculation of the denominator of Equation (9) is impractical in view of the limited computer performance of the system controller 14. Additionally the use of the above-noted approximation poses a risk as to unwanted occurrence of an unnegligible error (e.g., about 5%) in the fogging-corrected dose Df(x,y).

One currently available approach to shortening the calculation time is to presume the proximity effect-corrected dose Dp(x,y) to be a fixed value within the integration region upon calculation of the fogging-corrected dose Df(x,y), thereby to reduce the required calculation amount accordingly. Applying this "proximity effect constant" approximation, the resultant fog-corrected dose Df(x,y) is simplified as:

$$D_f(x,y) = \frac{E}{E + \theta D_p(x,y) \int K_f(x-x',y-y')dx'dy'}. \qquad (11)$$

Assume that the standardized back-scatter amount U(x,y) in Equation (4.2) is a standardized fogging amount V(x,y). Then, Equation (11) may be represented by:

$$D_p(x,y) = \frac{E}{\frac{1}{2} + \eta V(x,y)}. \qquad (12)$$

Putting Equation (12) into Equation (11), the fogging-corrected dose Df(x,y) is given by:

$$D_f(x,y) = \frac{E}{E + \theta \frac{E \cdot V(x,y)}{\frac{1}{2} + \eta V(x,y)}}. \qquad (13)$$

This equation is in turn expressed as:

$$D_f(x,y) = \frac{\frac{1}{2} + \eta V(x,y)}{\frac{1}{2} + \eta V(x,y) + \theta V(x,y)}, \qquad (14.1)$$

$$V(x,y) = \int \kappa_f(x-x',y-y')dx'dy'. \qquad (14.2)$$

Calculating using these equations the fog-corrected dose Df(x,y) per fog correction mesh region with each side length of 1 mm makes it possible to greatly lessen the processing time in comparison with the above-noted straightforward calculation scheme. Unfortunately, the advantage of this approach does not come without accompanying a penalty which follows. Due to the use of the fog correction mesh regions larger in size than those meshes for the proximity effect correction use, the resulting fog correction error becomes greater to an extent that is never acceptable in practical applications.

To avoid this problem, the procedure 80 embodying this invention shown in FIG. 3 is arranged so that the proximity effect-corrected dose Dp(x,y) is set to a variable value rather than the fixed value over the influence range of the fogging effect. This variable proximity effect-corrected dose Dp(x, y)—i.e., proximity effect-corrected dose Dpf(x,y) for exclusive use in the fog correction—is numerically determined through computation at a substep S2 prior to the substep S1 for fog-corrected dose calculation. This is one of the salient features unique to the illustrative embodiment.

More specifically, after having completed the calculation of the above-noted proximity effect-corrected dose Dp(x,y) at step 85, the procedure 80 goes to a preprocessing step in the fogging effect-corrected dose calculation step 86—that is, substep S0 of computing the value of a proximity effect-corrected dose Dpf(x,y) for exclusive use during the fogging effect correction. At this step S0, the "prestage" calculator 44 in upstream of the fogging-corrected dose calculator 46 of FIG. 1 calculates the fog correction-use proximity-corrected dose Dpf(x,y) that is variable in value upon execution of the integration calculation of the denominator of Equation (9), that is, Equation (10). To reduce or minimize the occurrable error of Equation (14), the integral calculation of Z(x,y) as shown in Equation (10) is executed at an adequate "coarse" that does not degrade the accuracy of fog correction. A practically implementable method of it is as follows.

First, determine the exact size of fog correction-use proximity effect correction mesh regions in the pattern draw area of the photomask 28. Principally this mesh size is specifically determined to have a side length as large as possible while at the same time letting fog correction errors remain less enough to be negligible in practical applications.

Figure 4:
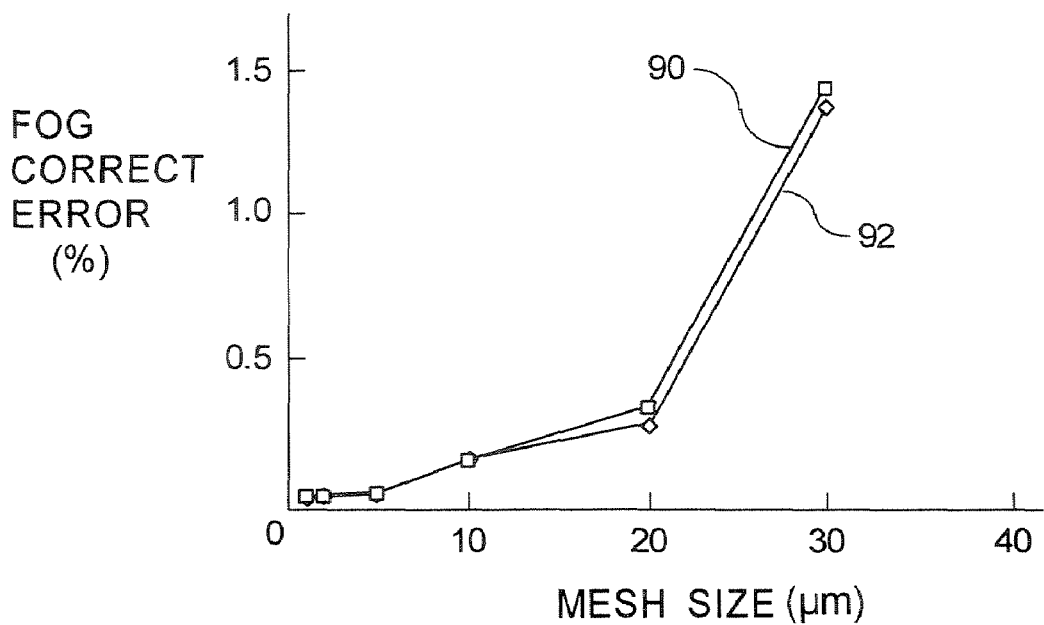
FIG. 4 is a graph showing, based on actual measurements, a plot of fogging correction error versus mesh size for each of equally spaced line-and-space (L/S) patterns with different mesh sizes for proximity effect correction.

See a graph shown in FIG. 4. This shows typical plots of fog correction error versus correction-use proximity correction mesh size in the correction based on Equation (9) for an equally spaced line-and-space ("1:1 L/S") pattern with a linewidth and distance being made equal to each other, which pattern is a square shape with each side of 10 cm. In the calculations required, various kinds of parameters as used therein are set as follows:

proximity effect (PE) correction coefficient: $\eta=0.6$
fogging effect (FE) correction coefficient: $\theta=0.1$
PE influence range $\kappa_p$: Gauss distribution with $\sigma=10$ μm
FE influence range $\kappa_f$: Gauss distribution with $\sigma=1$ cm.

In the discussion below, these parameter values will be employed except as otherwise indicated.

In the graph of FIG. 4, a plot line 90 is in a case where the fogging correction-use proximity effect-corrected dose Dpf (x,y) was calculated only for the least ordered term (i.e., zero-order term) of the proximity effect as indicated in Equation (4.2), whereas a plot 92 is in case the fog correction-use proximity-corrected dose Dpf(x,y) was computed up to a term of the third order of each of Equations (4.1) to (4.4). As apparent from viewing this graph, a difference between these cases in measured value change of fog correction errors is kept less and thus the lines 90 and 92 are very close to each other. Consequently, in order to reduce or "save" the calculation amount, the calculation involved is forced to be executed relative to the zero-order term only, with its higher order terms being excluded therefrom. Typically a time taken for this calculation until the zero-order term is approximately 60% of that needed for an extensive calculation up to the third-order term.

As shown in FIG. 4, the fogging correction error in each case generally increases with an increase in mesh size for proximity effect correction. When the mesh size becomes greater than 5 μm, the fog correction error gradually increases. When the mesh size exceeds 20 μm, its rate of increase becomes larger. At 30 μm the fog correction error rapidly grows so that it is no longer acceptable. However, it is found by the inventors as named herein that the mesh size stays at a practically acceptable low level while it falls within a range of from 1 to 5 μm (this is about one-half of σ). In other words, letting the mesh size be as large as 5 μm results in the fog correction error being kept at substantially the same level. Accordingly, at the substep S0 shown in FIG. 3, the calculator 44 of FIG. 1 sets the mesh size of proximity effect-corrected dose Dp(x,y) to 5 μm. Additionally, if the influence distribution $\kappa_p$ of proximity effect is not Gauss distribution, the mesh size may be set to about half the influence range.

More specifically in the step S0 shown in FIG. 2, the fogging effect correction-use proximity effect-corrected dose calculator 44 sets the mesh size M1 of a mesh region used for calculation of the fog correction-use proximity effect to a specific value which is midway between the fog correction mesh size M2 and proximity effect correction mesh size M2 of the pattern writing surface area of mask 28—that is, at one-half (½) of σ as equal to about 5 μm—and then calculates the fog correction-use proximity-corrected dose Dpf(x,y) in units of such specifically sized mesh regions. This dose calculation is done up to the zero-order term of its integration formula, with other terms of higher orders being intentionally excluded from the calculation. Respective values of per-mesh fog correction-use proximity-corrected dose Dpf(x,y) thus calculated in this way are stored in the internal memory 54 of control computer 30.

Subsequently at substep S1, the calculator 46 reads the fogging correction-use proximity-corrected dose Dpf(x,y) being presently stored in the memory 54 and then uses it to compute the fog-corrected dose Df(x,y) that also contains therein the influence of the proximity effect during electron beam pattern drawing of the mask 28. This fog-corrected dose Df(x,y) is calculable per fog correction mesh region having its intrinsic mesh size M2—here, 1 mm—in accordance with Equation (9) presented above. The resulting fog-corrected dose Df(x,y) calculated is stored in memory 54.

Figure 5:
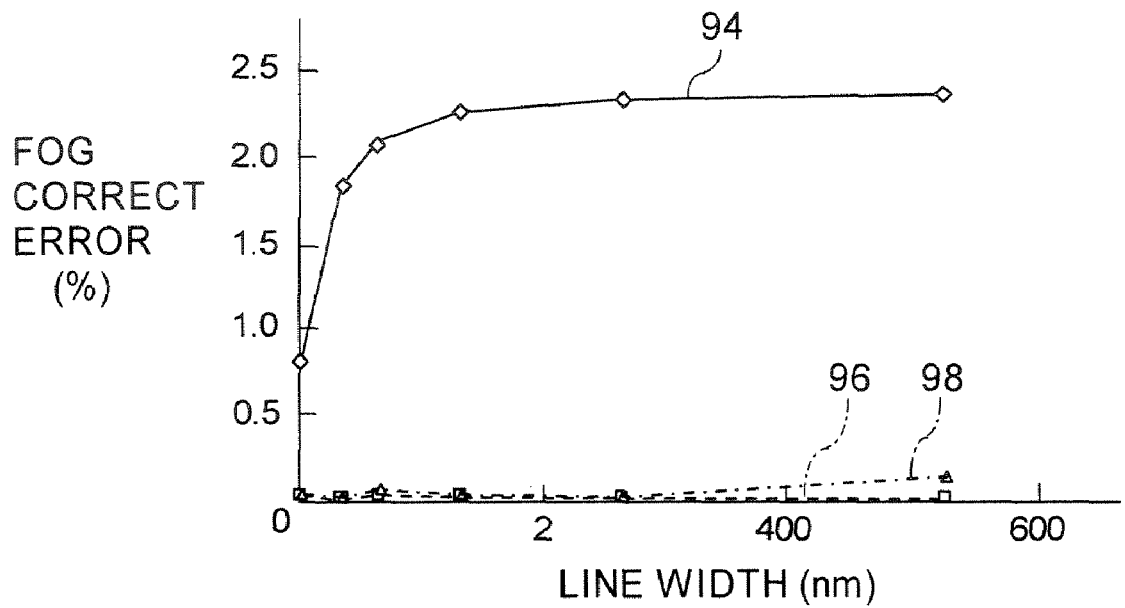
FIG. 5 is a graph showing, based on measurements, fogging-effect correction errors at varying pattern linewidth values.

See FIG. 5, which is a graph showing some plot lines of fogging correction error versus "1:1 L/S" pattern linewidth characteristics. A plot line 94 indicates a change in fogging-corrected dose Df(x,y) as calculated under an assumption that the fog correction-use proximity-corrected dose Dpf(x,y) is constant within the integration region of Equation (10) shown in Equations (14.1) to (14.4). A plot line 96 indicates a change in fog-corrected dose Df(x,y) in the case where the fog correction-use proximity-corrected dose Dpf(x,y) is made variable in value and where calculations are performed up to the third order term of integral equation while setting the correction mesh size therefor to its intrinsic value, e.g., 1 μm. A curve 98 shows a change in fog-corrected dose Df(x,y) in case the mesh size M1 of fog correction-use proximity-corrected dose Dpf(x,y) is increased to 5 μm and calculations are executed up to the integral equation's lowest order term, i.e., zero order term, with those calculations of its higher order terms being omitted.

As apparent from this graph, when the L/S pattern linewidth is increased from 1 μm to 512 μm, the curve 94 is such that the fog correction error exhibits a higher value in excess of 2.0 while curve 96 stays at a very low level. Regarding curve 98, this also stays at a low level which is acceptable in the viewpoint of practical applications although curve 98 is somewhat higher in fog correction error than curve 96. This well demonstrates that the method for numerical determination of the fogging-corrected dose in this embodiment advantageously offers its ability to lessen or minimize possible correction errors.

Also importantly, the fog-corrected dose calculator 46 is specifically arranged to execute computation of more than one term of higher order than the zero order term of the fogging-corrected dose Df(x,y). This computation is done using:

$$D_f(x, y) = \sum_{i=0}^{\infty} D_f^i(x, y) = D_f^0(x) + D_f^1(x) + \ldots , \quad (15.1)$$

$$D_f^0(x, y) = \frac{E}{E + \theta Z(x, y)}, \quad (15.2)$$

$$Z(x, y) = \int D_p(x', y') \kappa_f(x - x', y - y') dx' dy', \quad (15.3)$$

$$D_f^n(x, y) = \frac{-\theta D_f^0(x, y)}{E} \begin{bmatrix} \int D_f^{n-1}(x', y') D_p(x', y') \kappa_f \\ (x - x', y - y') dx' dy' - \\ D_f^{n-1}(x, y) Z(x, y) \end{bmatrix} \quad (15.4)$$

$(n \geq 1)$.

where "n" is the order or degree of correction term.

Figure 6:
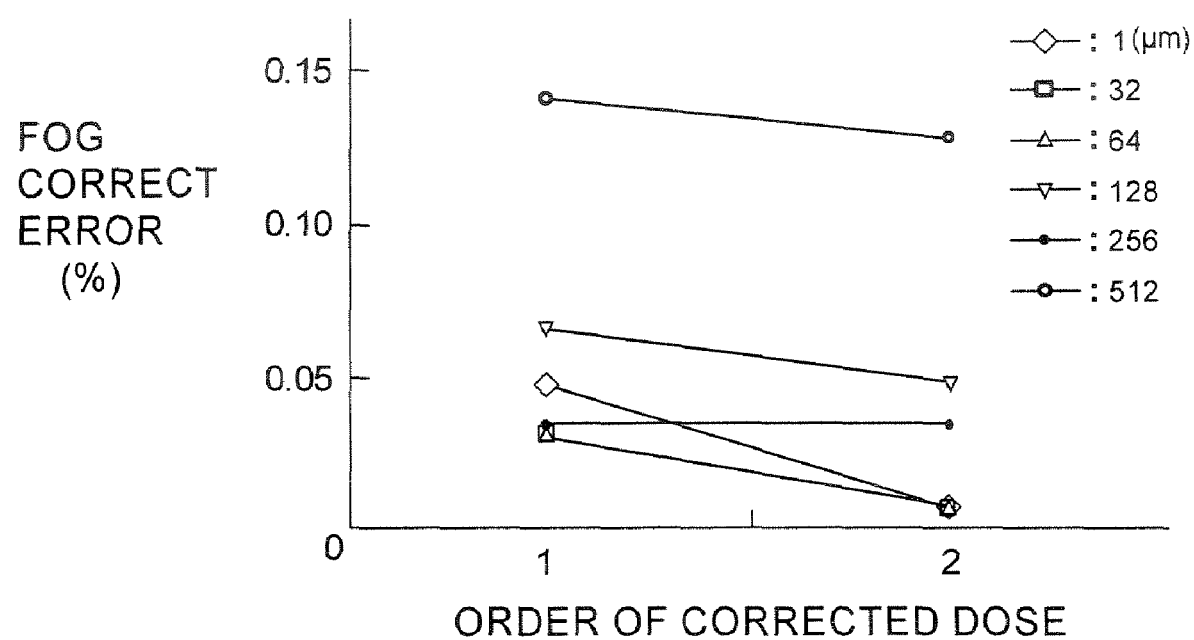
FIG. 6 graphically shows based on measurements fog correct errors vs. order of fog-corrected dose, i.e., correction term order for some typical pattern linewidths.

See next a graph of FIG. 6. This shows how the fogging correction error varies relative to the integration order of fogging-corrected dose Df(x,y). In FIG. 6, this error change shows actual measured values when calculating up to the minimum or zero order term and those obtained when calculating up to the first order term in respective cases where the 1:1-L/S pattern linewidth is set to 1 μm, 32 μm, 64 μm, 128 μm, 256 μm and 512 μm. As apparent from viewing this graph, execution of the calculation processing up to the integral term of higher order than the least significant order results in the fog correction error being noticeably reduced.

As the square 1:1-L/S pattern is used here, the fog correction error due to the above-noted approximation is inherently as small as 0.14% or below and thus a difference relative to the case of the higher order term being also subjected to the computation is without particular distinction; however, if the "up-to-higher-order calculation" feature of this embodiment is applied to rectangular pattern shapes, it is expectable to attain distinctive improvements of 5% or more in reduction of fog correction errors. Conclusively, the fogging effect-corrected dose calculator 46 is designed to calculate the fogging-corrected dose Df(x,y) that contains an integration term of higher order than the least significant (zero) order term thereof, thereby to ensure further lessening of the resultant fog correction error.

Turning back to the flowchart of FIG. 3, after completion of the processing at substep S1 in the fogging-corrected dose calculation process step 86, the procedure 80 goes next to step 87. In this step the corrected dose value combiner 48 reads out of the memory 54 both the proximity effect-corrected dose Dp(x,y) and the fogging-corrected dose Df(x,y) being presently stored therein, and then combines them together by multiplication to thereby determine a total or "final" beam dose D(x,y). More precisely, calculate a product of the proximity effect-corrected dose Dp(x,y) and fogging-corrected dose Df(x,y) in accordance with Equation (2). The write beam dose D(x,y) calculated is stored in the memory 54.

At subsequent step 88, the shot time calculator 50 reads the beam dose D(x,y) from memory 54 for calculation of a per-shot beam irradiation time Tr. This is substantially equal to:

$$Tr = D(x,y)/J \cdot Dref, \quad (16)$$

where J is the beam current density, and Dref is the reference irradiation amount. The control computer 30 generates at its output a signal indicative of this irradiation time Tr, which is passed to the deflection control circuit 52 that is associated with the blanking deflector 22 in pattern writing unit 12.

Then, at step 89, the deflection controller 52 is responsive to receipt of the output signal of control computer 30, for providing operation control of the blanking deflector 22 in a way such that the electron beam 58 which is writing a pattern on the mask 28 is deflected and turned off after elapse of the irradiation time Tr thus defined. In other words, the beam is controlled to hit mask 28 with the optimal dose D so that a desired mask pattern is drawn on its surface and, thereafter, beam 58 is deflected by deflector 22 to change its traveling route or "orbit" whereby it is blocked by the blanking aperture plate 24 so that the beam no longer reaches mask 28. In this way, the desired circuit pattern is written on mask 28 while performing calculations of the proximity effect-corrected dose Dp(x,y) and fogging-corrected dose Df(x,y) in a parallel way to the progress of fabrication process—that is, while performing the proximity-effect/fogging correction on a real time basis.

In accordance with the EBL tool 10 of FIG. 1 employing the proximity/fogging effect-corrected beam dose determination method shown in FIG. 3, it is possible to achieve superior fogging correctability with increased accuracy. This can be said because the fogging-corrected dose Df(x,y) per se takes account of the influence of the proximity effect. More specifically, the proximity effect-corrected dose Dpf(x,y) for specific use in the course of calculating the fogging-corrected dose Df(x,y) is computed as an adequate variable value in a case-sensitive way without assuming (approximating) it to be a fixed value within the integration region of fog-corrected dose computation. Thus it is possible to reduce fog correction errors, thereby to enable improvement of the multiple irradiation effect correction accuracy.

In addition, the calculation of the fog correction-use proximity-corrected dose Dpf(x,y) is such that its mesh size M1 is set smaller than the mesh size M2 inherent to the fogging-corrected dose Df(x,y) and yet larger than the mesh size M3 of the proximity effect-corrected dose Dp(x,y). Thus it becomes possible to lessen the necessary calculation processing amount to thereby shorten the required calculation time while at the same time achieving the reduced level of fog correction errors that is substantially as low as that in the case of M1 being set equal to M3. This leads to speed-up of the corrected dose computing process, i.e., an increase in process throughputs.

For example, suppose that the mesh size M2 in the calculation of the fogging-corrected dose Df(x,y) is about 1 mm as usual, and the mesh size M3 of proximity effect-corrected dose Dp(x,y) is at 1 μm. In this case, let the mesh size M1 of fog correction-use proximity-corrected dose Dpf(x,y) be set to 5 μm. This tells that if the proximity-effect influence range $\kappa_p$ exhibits Gauss distribution then the mesh size M1 is equivalent to one-half of its range σ (=10 μm). If not Gauss distribution, the size M1 may be set at the half of the range σ. With this 5 μm mesh size setting, a total mesh number decreases to a fifth (⅕) of that in the case of 1-μm mesh size setup, with the needed calculation time being reduced by a factor of twenty five (1/25). This can be said because the corrected dose calculating time is in inverse proportion to the square of a total mesh number.

A further advantage of this embodiment is as follows. The calculator 44 in control computer 30 is arranged to compute, upon calculation of the fogging correction-use proximity-corrected dose Dpf(x,y), only the zero order term, i.e., the term of the least significant order, while intentionally excluding its higher order terms from the computation. This makes it possible to minimize or at least greatly suppress the calculation amount without lowering the required correction accuracy to an extent that it departs from the practically allowable range. Thus it is possible to shorten the calculation time.

Also importantly, the fogging effect-corrected dose calculator 46 is configured to calculate the fogging-corrected dose Df(x,y) while letting more than one higher order term than its lowest order term be involved therein. Thus it is possible to lessen or eliminate the fog correction error of about 5%, which unavoidably occurs in the currently established approach—i.e., the technique for applying the above-stated presumption (approximation) of the Df value being at a fixed value within the integration region of Equation (7). This in turn brings further improvement of the multiple irradiation effect correction accuracy.

Figure 7:
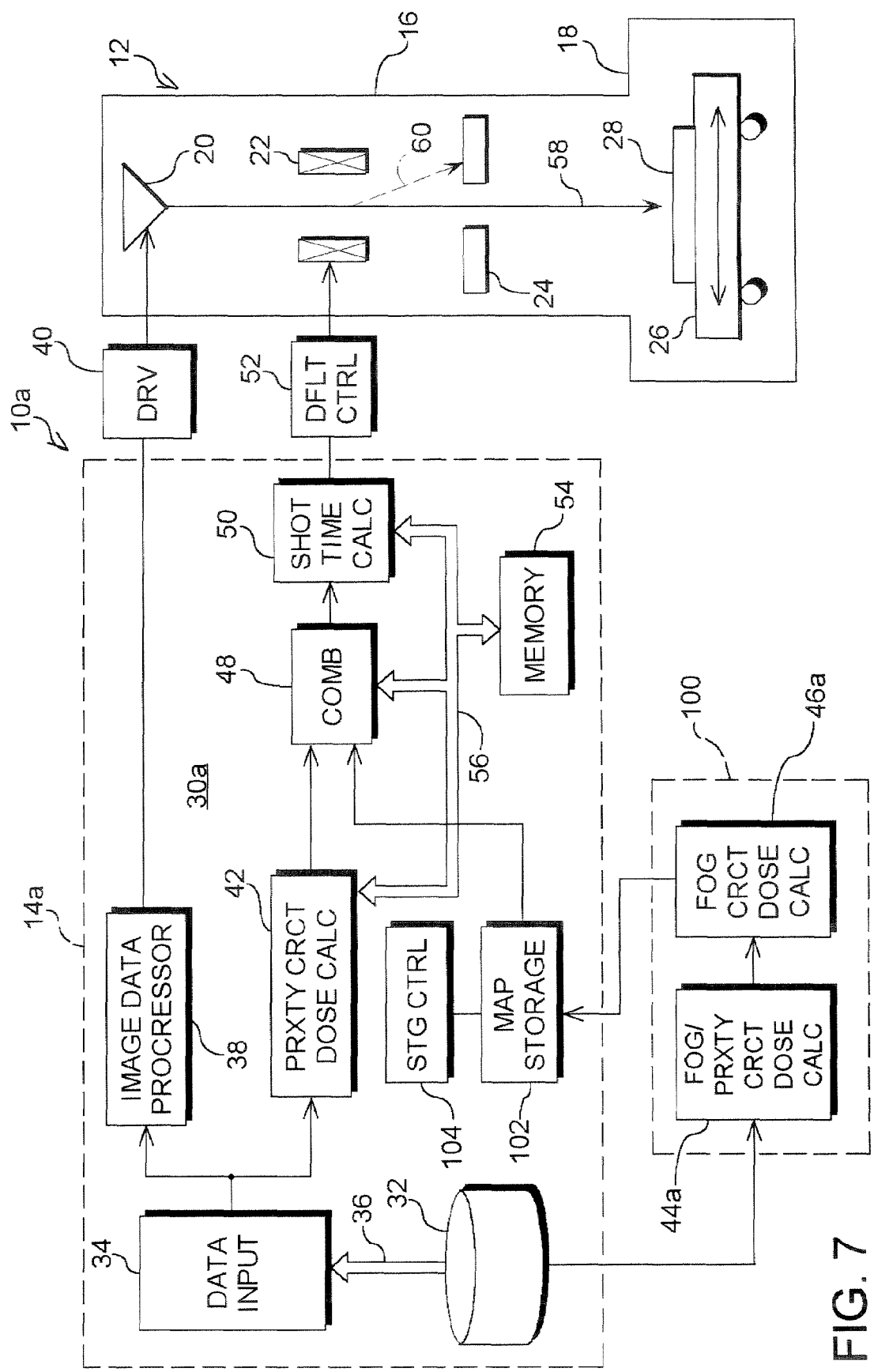
FIG. 7 illustrates, in block diagram form, an entire configuration of an electron beam microlithographic apparatus in accordance with another embodiment of the invention.

Turning to FIG. 7, an entire system configuration of a shaped electron beam lithographic (EBL) apparatus 10a also embodying this invention is shown. This EBL tool 10a is similar to that shown in FIG. 1 with the fogging effect correction-use proximity effect-corrected dose calculator 44 and the fog-corrected dose calculator 46 in control computer 30 being replaced by their functionally equivalent fogging effect correction-use proximity effect-corrected dose calculator 44a and fog-corrected dose calculator 46a which are built in an externally linkable server equipment 100, and also with a map data storage unit 102 being added to the computer 30.

With such an arrangement, while the previous embodiment EBL tool 10 is arranged to calculate the fogging-corrected dose Df(x,y) on a real-time basis in a parallel way to the pattern writing on photomask 28, the EBL tool 10a of FIG. 7 operates in a way such that the fogging-corrected dose Df(x,y) has already been calculated prior to the pattern drawing session. Resultant map data indicative of fogging-corrected dose values in units of square mesh regions with each side of 1 mm, for example, are prestored in the map storage 102. During pattern writing, access is given thereto to read this map data, and use this data to perform the beam dose correction required.

More precisely, the system controller 14 includes a control computer 30a. This computer is operatively connected to its externally associated server computer 100. This server may illustratively be a workstation or a high-performance personal computer (PC) or like computers. The server 100 has its built-in fogging effect correction-use proximity effect-corrected dose calculator 44a and fogging-corrected dose calculator 46a, wherein the former is connected to the magnetic disk device 32 such as HDD in controller 14 whereas the latter is coupled via a known interface (not shown) to the map storage 102 as internally provided in the control computer 30a. Map storage 102 is connected to a storage controller 104 that functions to manage data reading from storage 102. Map-format data as read out of storage 102 under control of the data manager 104—this data is representative of the precalculated fogging-corrected dose Df(x,y)—will then be sent forth to the corrected dose combiner 48, which may be a multiplier.

Figure 8:
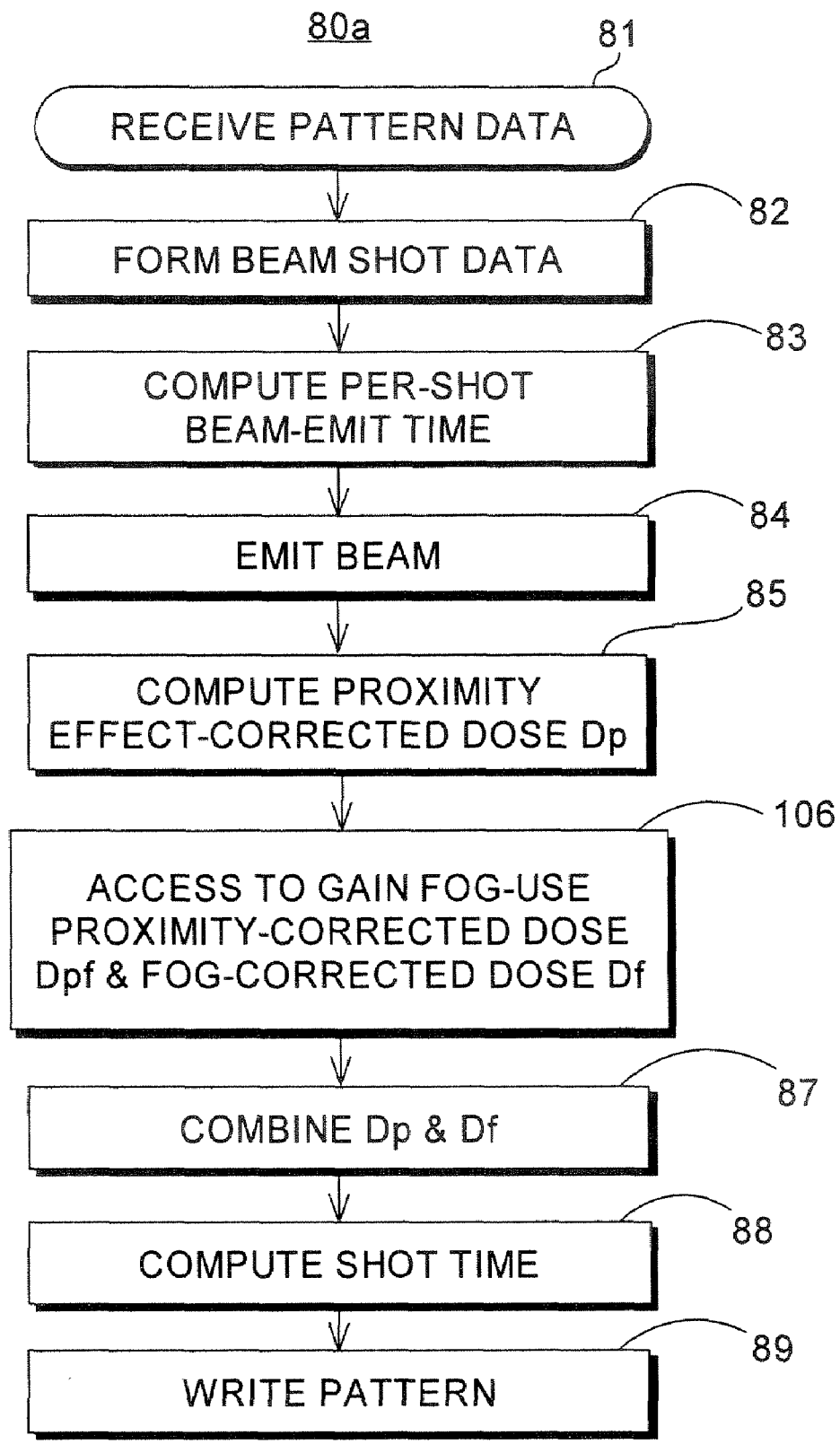
FIG. 8 is a flowchart of major processes of a beam dose correction method as used in the apparatus of FIG. 7.

See FIG. 8 which shows a flow diagram of a method for determining through computation the dose of a shaped electron beam 58 which is corrected in its related proximity effect and fogging effect occurring during circuit pattern writing on a workpiece 28, which is illustratively a photomask. A system procedure 80a as shown herein is essentially similar to that of FIG. 3 with the steps 86 and 87 being replaced by a step 106.

More specifically, after having calculated the proximity effect-corrected dose Dp(x,y) at step 85 in the way stated supra, the procedure 80a goes to step 106. At this step, the storage manager 104 provides access to the map storage 102. This storage stores in a map form the per-mesh fogging effect-corrected dose Df(x,y) as has been computed in advance by the external server 100. Data indicative of the fog-corrected dose as read from storage 102 is then passed to the corrected dose combiner 48 under control of manager 104. Combiner 48 combines or multiplies this fog-corrected dose to the proximity effect-corrected dose Dp(x,y) as output from the proximity-corrected dose calculator 42 to generate at its output a combined corrected dose D(x,y), which is then sent to the deflection controller 52. The following operations are similar to those in the previous embodiment.

In accordance with the EBL tool 10a of FIG. 7, the beam dose that is corrected in the fogging effect occurrable during pattern writing on the mask 28 is not calculated on a real-time basis but is computed in advance by the external associative server 100 prior to startup of the pattern writing, the data of which is prepared in the internal storage 102 of the control computer 30a. Using such precomputed fog-corrected dose allows the control computer 30a to become free from the burden to compute the dose at any time whenever it is required. Accordingly the calculation tasks in entirety of the EBL tool 10a are reduced, thereby making it expectable to increase the throughput of pattern writing processing. This system calculation function relocation or "transplantation" feature is devoted to further improvements in speed performance of the EBL system en masse.

Although the invention has been disclosed and illustrated with reference to particular embodiments, the principles involved are susceptible for use in numerous other embodiments, modifications and alterations which will be apparent to persons skilled in the art to which the invention pertains. While in the respective embodiments stated supra the task processing functionalities of the control computer 30, 30a are implemented by several hardware components as shown in FIGS. 1 and 7, these may be replaceable with a set of software program modules executable by general-purpose computers. Alternatively, a "hybrid" system with hardware and software combinations may be employed. Its part or entirety is designable to use firmware configurations. In this case the software program(s) is/are contained in one or more computer-installable recording media with storability or recordability of increased stability. Major example of such media are a compact disc read-only memory (CD-ROM), digital versatile disk (DVD), HD-DVD™, Blu-ray Disc™, portable external HDD equipment and equivalents thereto.

While the above-stated embodiments are such that the principles of this invention are applied to variable-shaped charged-particle beam lithographic systems, the invention should not exclusively be limited thereto and may alternatively be applicable to systems of the type using other kinds of energy radiation beams without requiring any inventive activities. Examples of such energy radiation include, but not limited to, light rays, X-rays, ion beams, and extreme-ultraviolet (EUV) radiation. Regarding the workpiece being subjected to pattern writing/exposure, this is not limited to the photomask and may alternatively be other similar structures, such as reticles, wafers, membranes, substrates or like structures. Additionally it would readily occur to ordinary technicians in the art that the write beam dose calculation technique incorporating the principles of this invention is employable for purposes other than the direct formation of a resist circuit pattern on workpieces, including fabrication of masks for use with light-stepper equipment and X-ray masks by way of example.

Although in the step S0 for calculation of the fog correction-use proximity-corrected dose Dpf(x,y) shown in FIG. 3, the mesh size M1 therefor is set to the specific value that is half the influence range σ (e.g., 5 μm), this is a mere typical example and is not to be construed as limiting the invention. Its value may be changed on a case-by-case basis insofar as M1 is between M2 and M3. If the computer employed is of extra-high performance and affords to have additional task-processing abilities, then M1 may be set at further less values. On the contrary, if processing time shortening is the top priority, it is permissible to set M1 to be substantially the same as σ or, alternatively, to a twofold value thereof.

Additional advantages and modifications or alterations will readily occur to those skilled in the art. The invention in its broader aspects is not limited to the specific details and illustrative embodiments as shown and described herein. Various modifications may be made without departing from the spirit and scope of the general inventive concept defined by the appended claims and equivalents thereof.

What is claimed is:

1. A lithographic apparatus for writing a pattern on a workpiece, said apparatus comprising:
   a pattern writing unit having a radiation source for emitting an energy beam and a beam column functioning as a beam pattern generator for deflecting the beam to timely adjust its traveling to thereby form a prespecified pattern image on the workpiece;
   a control unit connected to said pattern writing unit and including means for correcting proximity and fogging effects occurrable during pattern writing using the beam;
   said means including a first calculator unit operative to determine through computation a proximity effect-corrected dose for correction of the proximity effect, a functional module for calculation of a fogging-corrected dose for correction of the fogging effect while including therein influence of the proximity effect, a combiner unit responsive to receipt of the doses calculated for combining these doses together to thereby determine a total corrected dose and for generating at its output a signal indicative of the total corrected dose, and a beam controller responsive to receipt of the output signal for using said total corrected dose to provide a beam control signal for transmission to said beam column; and
   said functional module having a second calculator unit for calculation of a variable real value indicating influence of the proximity effect to be taken into account during correction of the fogging effect, and a third calculator unit operatively associated with said second calculator unit for using the variable value of the proximity effect to thereby calculate the fogging-corrected dose.

2. The apparatus of claim 1 wherein said second calculator unit divides a pattern write area of the workpiece into a plurality of rectangular elemental regions having a first size and calculates the variable value of the proximity effect in units of the regions and wherein the first size is less than a second size of elemental regions to be used by said third calculator unit and larger than a third size of elemental regions as used by said first calculator unit.

3. The apparatus of claim 2 wherein said first size is substantially one-half of or less than said second size.

4. The apparatus of claim 2 wherein during calculation of the variable value of the proximity effect, said second calculator unit calculates only a least significant order term of an integration equation thereof.

5. The apparatus of claim 4 wherein during calculation of the fogging-corrected dose, said third calculator unit calculates a least significant order term of an integration equation thereof and at least one term higher in order than the least significant order term.

6. The apparatus of claim 5 wherein the first to third calculator units at least partially include a hardware configuration made up of any one of electrical circuitry and electronic circuitry.

7. The apparatus of claim 5 wherein the first to third calculator units at least partially include a software configuration made up of software routines as executable by a digital computer.

8. The apparatus of claim 5 wherein the first to third calculator units at least partially include a firmware configuration having a storage media with digital computer executable software routines being preinstalled therein.

9. The apparatus of claim 8 wherein said firmware configuration includes a set of ordered instructions and data as stored in a nonvolatile semiconductor memory device.

10. The apparatus of claim 5 wherein said workpiece includes any one of a photomask, a reticle and a wafer.

11. The apparatus of claim 10 wherein said photomask has on its top surface a film of photosensitive resist material.

12. A method for beam dose correction adaptable for use in a lithographic system for writing a pattern on a workpiece by use of a beam of energy radiation, said method comprising the steps of:
    calculating a proximity effect-corrected dose for correction of a proximity effect occurrable during pattern writing;
    calculating a fog-corrected dose for correction of a fogging effect occurring during the pattern writing using the beam while including influence of the proximity effect;
    determining a total corrected dose by combining together the doses calculated;
    controlling the beam based on the total corrected dose; and
    said step of calculating a fog-corrected dose including a first substep of calculating a variable real value indicative of influence of the proximity effect to be taken into account during fog correction and a second substep of using the variable value of the proximity effect to calculate the fog-corrected dose.

13. The method of claim 12 wherein said first substep divides a pattern write area of the workpiece into a plurality of rectangular elemental regions having a first size and calculates the variable value of the proximity effect in units of the regions and wherein the first size is less than a second size of elemental regions to be used by said second substep and larger than a third size of elemental regions as used by said step of calculating a proximity effect-corrected dose.

14. The method of claim 13 wherein said first size is substantially half or less than said second size.

15. The method of claim 13 wherein during calculation of the variable value of the proximity effect, said first substep includes calculating only a least significant order term of an integration equation thereof.

16. The method of claim 13 wherein during calculation of the fog-corrected dose, said second substep includes calculating a least significant order term of an integration equation thereof and at least one term higher in order than the least significant order term.

17. A computer executable software program for beam dose correction to be adapted for use in a charged particle beam lithography system, said program comprising the routines of:

calculating a proximity effect-corrected dose for correction of a proximity effect occurrable during pattern writing using a shaped charge-particle beam;

calculating a fog-corrected dose for correction of a fogging effect occurring during the pattern writing using the beam while including therein influence of the proximity effect;

determining a total corrected dose by combining together the doses calculated;

controlling the beam based on the total corrected dose;

the routine for calculating a fog-corrected dose including a first subroutine for calculating a variable real value indicative of influence of the proximity effect to be taken into account during fog correction and a second subroutine for using the variable value of the proximity effect to calculate the fog-corrected dose; and said first subroutine being for dividing a pattern write area of the workpiece into a plurality of rectangular elemental regions having a first size and calculates the variable value of the proximity effect in units of the regions and wherein the first size is less than a second size of elemental regions to be used said second subrouting and larger than a third size of elemental regions as used by said routine of calculating a proximity effect-corrected dose.

* * * * *

UNITED STATES PATENT AND TRADEMARK OFFICE
CERTIFICATE OF CORRECTION

PATENT NO. : 7,525,110 B2  Page 1 of 1
APPLICATION NO. : 11/671789
DATED : April 28, 2009
INVENTOR(S) : Junichi Suzuki et al.

It is certified that error appears in the above-identified patent and that said Letters Patent is hereby corrected as shown below:

Column 20, line 12, after "used" insert --by--.

Signed and Sealed this

Seventh Day of July, 2009

JOHN DOLL
*Acting Director of the United States Patent and Trademark Office*